(12) United States Patent
Kumar et al.

(10) Patent No.: US 7,327,150 B2
(45) Date of Patent: Feb. 5, 2008

(54) INTEGRATED CIRCUIT PACKAGE RESISTANCE MEASUREMENT

(75) Inventors: Arvind Kumar, Brookline, MA (US); Kambiz Munshi, Framingham, MA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 11/248,775

(22) Filed: Oct. 11, 2005

(65) Prior Publication Data

US 2007/0080696 A1    Apr. 12, 2007

(51) Int. Cl.
*G01R 27/08* (2006.01)
*G01R 31/26* (2006.01)

(52) U.S. Cl. .................................. 324/691; 324/765
(58) Field of Classification Search ................ 324/763, 324/703, 707, 713, 691, 693
See application file for complete search history.

(56) References Cited

U.S. PATENT DOCUMENTS

| | | | | |
|---|---|---|---|---|
| 4,734,641 | A * | 3/1988 | Byrd et al. ............... | 324/158.1 |
| 5,386,188 | A * | 1/1995 | Minneman et al. ......... | 324/126 |
| 6,448,811 | B1 | 9/2002 | Narendra et al. ............. | 326/82 |
| 6,737,909 | B2 | 5/2004 | Jaussi et al. ................. | 327/541 |
| 6,841,852 | B2 * | 1/2005 | Luo et al. .................... | 257/666 |
| 6,879,489 | B2 | 4/2005 | Koertzen ..................... | 311/704 |
| 6,894,513 | B2 * | 5/2005 | Sen et al. .................... | 324/719 |
| 6,954,706 | B2 | 10/2005 | Poirier et al. ................ | 702/65 |
| 6,959,258 | B2 * | 10/2005 | Smith et al. ................. | 702/132 |
| 7,029,932 | B1 * | 4/2006 | Hiser et al. ................... | 438/14 |
| 2003/0098735 | A1 | 5/2003 | Jaussi et al. ................ | 327/541 |
| 2004/0158449 | A1 | 8/2004 | Koertzen ..................... | 361/704 |
| 2005/0040810 | A1 | 2/2005 | Poirier et al. ............ | 324/150.1 |
| 2005/0040900 | A1 | 2/2005 | Bostak et al. ................. | 331/44 |
| 2005/0040901 | A1 | 2/2005 | Bostak et al. ................. | 331/57 |
| 2005/0043909 | A1 * | 2/2005 | Poirier et al. ................ | 702/65 |
| 2007/0044047 | A1 * | 2/2007 | Kurihara et al. .............. | 716/2 |

OTHER PUBLICATIONS

Poirier, Christopher, et al., "Power and Temperature Control on a 90nm Itanium-Family Processor", 2005 IEEE International Solid-State Circuits Conference (ISSCC), Digest of Technical Papers, vol. 1, pp. 304-305 (Feb. 6-10, 2005).

* cited by examiner

*Primary Examiner*—Anjan Deb (57) ABSTRACT

For one embodiment, an integrated circuit includes a node to couple one or more components to the integrated circuit to carry current through a package for the integrated circuit. The integrated circuit also includes a monitor to measure a resistance of the package based at least in part on a reference resistance of the package and a resistance of one or more components that are to carry current through the package. For another embodiment, current through one or more components that are to carry current through a package for an integrated circuit is controlled. A resistance of the package is measured based at least in part on a reference resistance of the package and a resistance of one or more components that are to carry current through the package.

37 Claims, 8 Drawing Sheets

INTEGRATED CIRCUIT PACKAGE RESISTANCE MEASUREMENT

FIELD

Embodiments described herein generally relate to integrated circuits.

BACKGROUND

An integrated circuit, such as for a microprocessor for example, may use a feedback control system to help control power consumption and/or heat dissipation for the integrated circuit. One feedback control system helps maintain the integrated circuit within a desired power envelope despite variations in power consumption due to, for example, variations in software load.

BRIEF DESCRIPTION OF THE DRAWINGS

Embodiments are illustrated by way of example and not limitation in the figures of the accompanying drawings, in which like references indicate similar elements and in which.

The FIGURES of the drawings are not necessarily drawn to scale.

DETAILED DESCRIPTION

The following detailed description sets forth example embodiments of apparatuses, methods, mediums, and systems relating to integrated circuit package resistance measurement. Features, such as structure(s), function(s), and/or characteristic(s) for example, are described with reference to one embodiment as a matter of convenience; various embodiments may be implemented with any suitable one or more described features.

Figure 1:
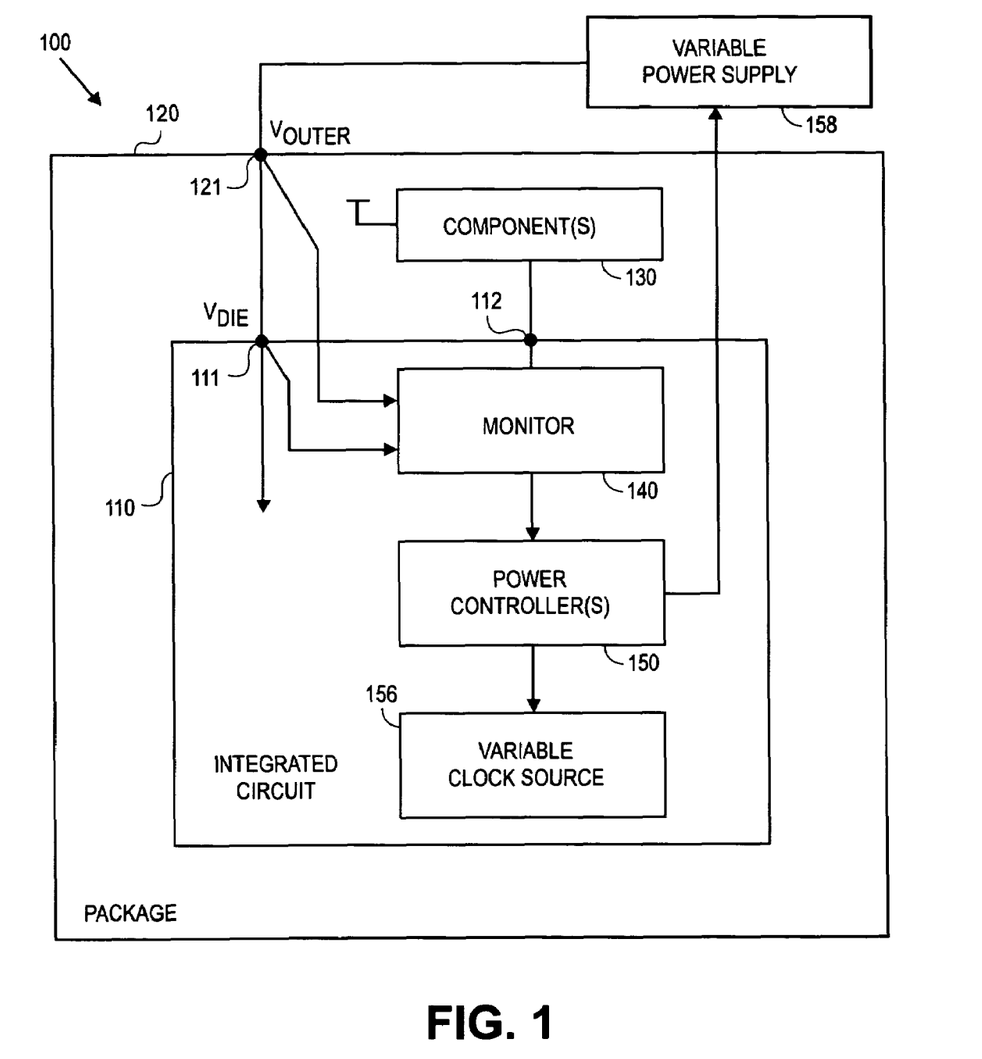
FIG. 1 illustrates, for one embodiment, a block diagram of a packaged integrated circuit having a monitor to measure a resistance of a package for the packaged integrated circuit based at least in part on a reference resistance of the package and a resistance of one or more components that are to carry current through the package.

FIG. 1 illustrates, for one embodiment, a packaged integrated circuit 100 having a package 120 for an integrated circuit 110. Integrated circuit 110 for one embodiment may have a node 112 to couple one or more components 130 to integrated circuit 110 to carry current through package 120. integrated circuit 110 may define node 112 in any suitable manner, such as a bonding pad for example. Integrated circuit 110 for one embodiment may have a monitor 140 to measure a resistance of package 120 based at least in part on a reference resistance of package 120 and a resistance of one or more components 130 that are to carry current through package 120.

EXAMPLE USE OF MEASURED PACKAGE RESISTANCE

Integrated circuit 110 may use monitor 140 to measure a resistance of package 120 for any suitable purpose.

Figure 2:
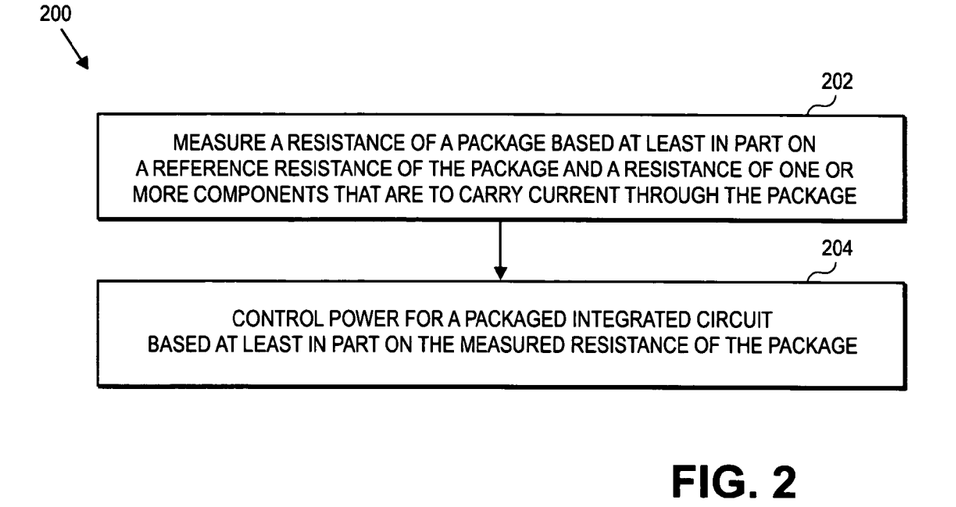
FIG. 2 illustrates, for one embodiment, a flow diagram to control power for the packaged integrated circuit of FIG. 1.

Integrated circuit 110 for one embodiment, as illustrated in FIG. 1, may optionally comprise one or more power controllers 150 to help control power for packaged integrated circuit 100 as illustrated in a flow diagram 200 of FIG. 2. For block 202 of FIG. 2, monitor 140 may measure a resistance $R_{package}$ of package 120 based at least in part on a reference resistance of package 120 and a resistance of one or more components 130 that are to carry current through package 120. For block 204, one or more power controllers 150 may control power for packaged integrated circuit 100 based at least in part on the measured resistance $R_{package}$ of package 120.

Monitor 140 for one embodiment may also measure power supplied to integrated circuit 110 based at least in part on the measured resistance $R_{package}$ of package 120. Power controller(s) 150 for one embodiment may then be coupled to receive from monitor 140 one or more signals representative of or corresponding to the measured power to control power for integrated circuit 110. Power controller(s) 150 for one embodiment may control power for integrated circuit 110 to help control power consumption and/or heat dissipation for integrated circuit 110.

Integrated circuit 110 for one embodiment, as illustrated in FIG. 1, may optionally comprise a variable clock source 156. A power controller 150 for one embodiment may be coupled to control variable clock source 156 to vary the frequency of one or more clock signals generated by variable clock source 156 to clock or activate circuitry of integrated circuit 110 and therefore help control power consumption and/or heat dissipation for integrated circuit 110. Variable clock source 156 for one embodiment may be coupled to receive an external clock signal having a predetermined frequency from a clock source external to packaged integrated circuit 100 and may comprise any suitable circuitry to generate one or more internal clock signals of any suitable frequency in response to one or more control signals from a power controller 150. A power controller 150 for one embodiment may be coupled to control a variable clock source external to packaged integrated Circuit 100.

A power controller 150 for one embodiment, as illustrated in FIG. 1, may be coupled to control a variable power supply 158 external to packaged integrated circuit 100. Packaged integrated circuit 100 for one embodiment may be coupled to receive power from variable power supply 158. A power controller 150 for one embodiment may control variable power supply 158 to vary a supply voltage supplied to integrated circuit 110 by variable power supply 158 and therefore help control power consumption and/or heat dissipation for integrated circuit 110. Variable power supply 158 may comprise any suitable circuitry to supply a supply voltage at any suitable level to integrated circuit 110 in response to one or more control signals from a power controller 150. Variable power supply 158 for one embodiment may comprise a power supply, such as an alternating current to direct current (AC-DC) adapter or a battery for example, and a voltage regulator, such as a direct current to direct current (DC-DC) converter for example, coupled to the power supply and to a power controller 150 to supply a variable supply voltage to integrated circuit 110.

Monitor 140 for one embodiment may be coupled to measure a voltage $V_{die}$ of a die for integrated circuit 110 and a voltage $V_{package}$ across package 120 for integrated circuit 10 and may measure power supplied to integrated circuit 110 based on the measured die voltage $V_{die}$, the measured package voltage $V_{package}$, and the measured package resistance $R_{package}$.

Monitor 140 for one embodiment may measure power P supplied to integrated circuit 110 in accordance with the following equation.

$$P=(V_{package}*V_{die})/R_{package}$$

Note the amount of power P supplied to integrated circuit 110 ideally is as follows:

$$P=I*V_{die}$$

where I is the amount of current drawn by integrated circuit 110 and is ideally also equal to the amount of current drawn through package 120 in accordance with the following equation.

$$I=V_{package}/R_{package}$$

Monitor 140 may measure die voltage $V_{die}$ and package voltage $V_{package}$ in any suitable manner. Monitor 140 for one embodiment may be coupled to a die power grid for integrated circuit 110 at a node 111 to measure die voltage $V_{die}$. Monitor 140 for one embodiment may be coupled to a node 121 at or near an outer side of package 120 to measure an outer voltage $V_{outer}$. Monitor 140 may then measure package voltage $V_{package}$ in accordance with the following equation.

$$V_{package}=V_{outer}-V_{die}$$

Package Resistance Measurement

Figure 3:
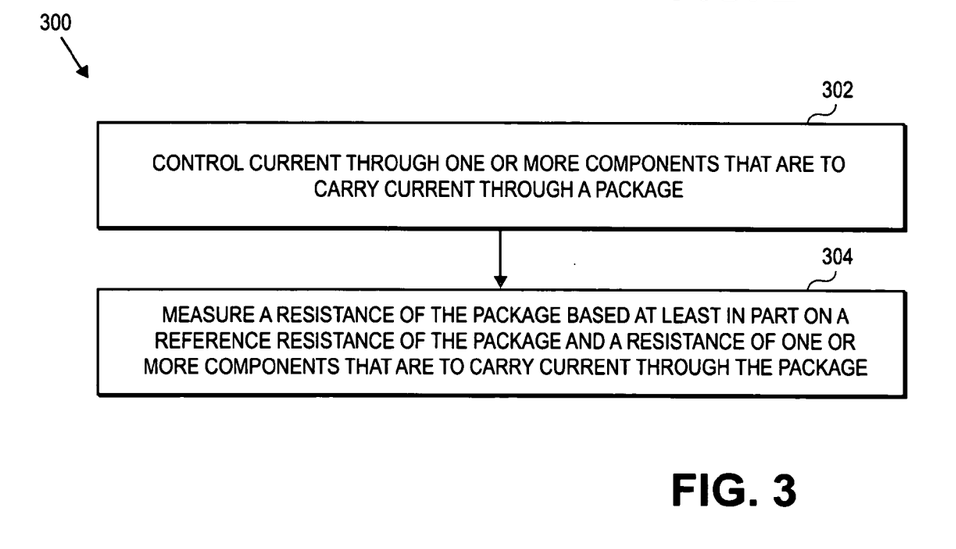
FIG. 3 illustrates, for one embodiment, a flow diagram to measure a resistance of the package for the packaged integrated circuit of FIG. 1.

Monitor 140 for one embodiment may measure a resistance of package 120 in accordance with a flow diagram 300 of FIG. 3. For block 302 of FIG. 3, monitor 140 may control current through one or more components 130 that are to carry current through package 120 for integrated circuit 110. For block 304, monitor 140 may measure a resistance of package 120 based at least in part on a reference resistance of package 120 and a resistance of one or more components 130 that are to carry current through package 120.

Monitor 140 for one embodiment may use one or more components 130 to help replicate variation in the resistance of package 120 during operation of integrated circuit 110. The resistance of package 120 may vary, for example, due to temperature variations of package 120 and/or the die for integrated circuit 110. Monitor 140 for one embodiment may measure a resistance of package 120 under different operating conditions by using a reference resistance of package 120 to adjust measurements based at least in part on the resistance of one or more components 130 under such conditions. Monitor 140 may identify a reference resistance of package 120 in any suitable manner.

Monitor 140 for one embodiment may measure resistance of package 120 at a given temperature using a reference resistance of package 120 based on a measured resistance of package 120 at a reference temperature. Monitor 140 for one embodiment may then measure resistance of package 120 at a given temperature based at least in part on such a reference resistance of package 120 and the resistance of one or more components 130 at the given temperature.

A reference resistance of package 120 for one embodiment may be measured using a tester to place packaged integrated circuit 100 under a known set of load conditions at a tester temperature $T_{test}$, causing packaged integrated circuit 100 to sink a known current $I_{test}$. Monitor 140 for one embodiment may then measure a reference package voltage $V_{package}(T_{test})$ across package 120 to measure a reference package resistance $R_{package}(T_{test})$ in accordance with the following equation.

$$R_{package}(T_{test})=V_{package}(T_{test})/I_{test}$$

Monitor 140 for one embodiment may be coupled to node 121 at or near an outer side of package 120 to measure an outer voltage $V_{outer}(T_{test})$ and may be coupled to a die power grid for integrated circuit 110 at node 111 to measure a die voltage $V_{die}(T_{test})$. Monitor 140 may then measure reference package voltage $V_{package}(T_{test})$ in accordance with the following equation.

$$V_{package}(T_{test})=V_{outer}(T_{test})-V_{die}(T_{test})$$

For one embodiment, the tester may be used to measure a reference package voltage $V_{package}(T_{test})$ across package 120 and/or a reference package resistance $R_{package}(T_{test})$. The tester for one embodiment may then be used to upload reference package voltage $V_{package}(T_{test})$ and/or reference package resistance $R_{package}(T_{test})$ to monitor 140.

Figure 4:
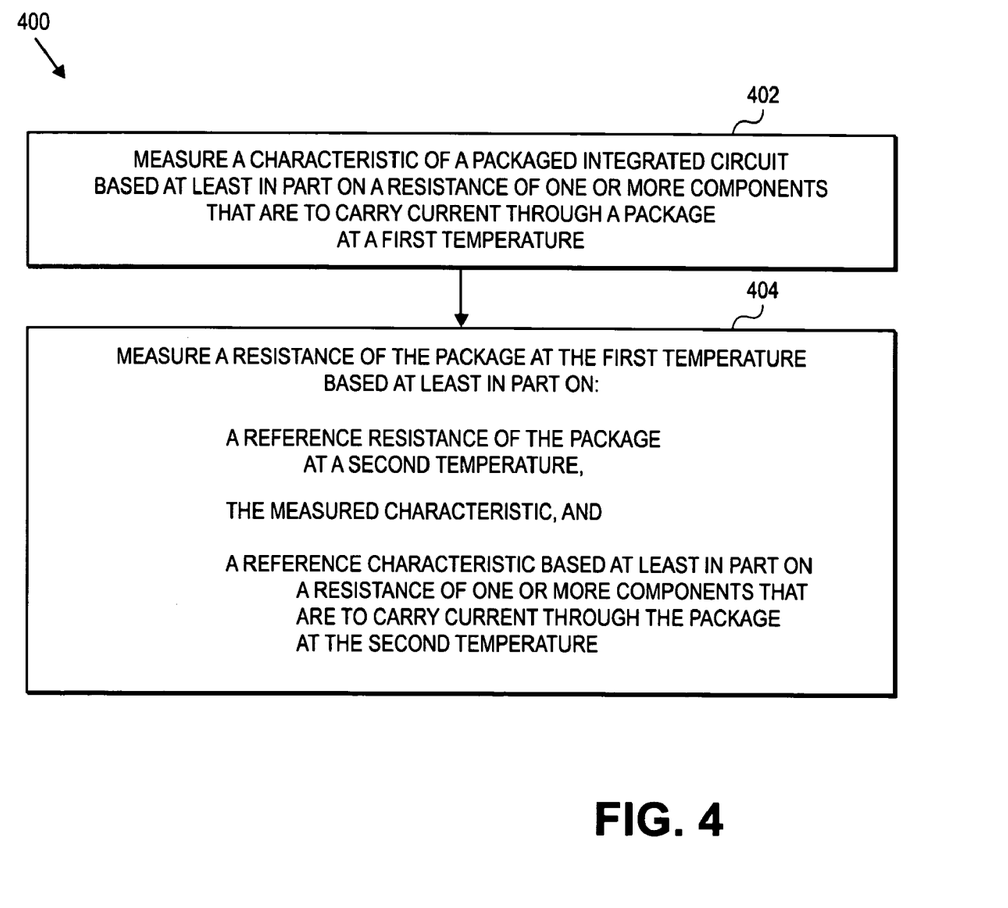
FIG. 4 illustrates, for one embodiment, a flow diagram to measure a resistance of the package for the packaged integrated circuit of FIG. 1.

Monitor 140 for one embodiment may measure resistance of package 120 at a temperature $T_1$, in accordance with a flow diagram 400 of FIG. 4. For block 402 of FIG. 4, monitor 140 may measure a characteristic $X(T_1)$ of packaged integrated circuit 100 based at least in part on a resistance $R_1(T_1)$ of one or more components 130 that are to carry current through package 120 at temperature $T_1$. For block 404, monitor 140 may measure a resistance $R_{package}(T_1)$ of package 120 at temperature $T_1$, based at least in part on a reference resistance $R_{package}(T_0)$ of package 120 at a temperature $T_0$, the measured characteristic $X(T_1)$, and a reference characteristic $X(T_0)$ of packaged integrated circuit 100 based at least in part on a resistance $R_1(T_0)$ of one or more components 130 that are to carry current through package 120 at temperature $T_0$.

Reference package resistance $R_{package}(T_0)$ for one embodiment may be measured using a tester. Temperature $T_0$ may therefore correspond to a tester temperature $T_{test}$. Reference characteristic $X(T_0)$ for one embodiment may be measured by monitor 140 while packaged integrated circuit 100 is at temperature $T_0$. Monitor 140 for one embodiment may measure reference characteristic $X(T_0)$ similarly as for block 402 of FIG. 4. Reference characteristic $X(T_0)$ for one embodiment may be measured by the tester while packaged integrated circuit 100 is at temperature $T_0$. The tester for one embodiment may then be used to upload reference characteristic $X(T_0)$ to monitor 140.

Monitor 140 for one embodiment may use the same reference package resistance $R_{package}(T_0)$ value and the same reference characteristic $X(T_0)$ value for multiple measurements of package resistance $R_{package}$ at different times.

Monitor 140 for one embodiment may update the values of reference package resistance $R_{package}(T_0)$ and reference characteristic $X(T_0)$ for one or more measurements of package resistance $R_{package}$ based on prior measurements of package resistance $R_{package}$ and characteristic X.

Monitor 140 for one embodiment may use a relationship between reference characteristic $X(T_0)$ and reference package resistance $R_{package}(T_0)$ to measure package resistance $R_{package}(T_1)$ based on measured characteristic $X(T_1)$. Monitor 140 may use any suitable characteristic X to measure package resistance $R_{package}$.

Monitor 140 for one embodiment may use as characteristic X a ratio between a resistance $R_1$ of one or more first components 130 that are to carry current through package 120 and a resistance $PR_2$ of one or more second components that are to carry current in packaged integrated circuit 100.

The resistance $R_2$ for one embodiment may be relatively constant as compared to resistance $R_1$.

Resistance $R_1$ ideally is as follows:

$$R_1 = V_1/I_1$$

where $V_1$ is the voltage across one or more first components 130 and $I_1$ is the current flowing through one or more first components 130.

Resistance $R_2$ is as follows:

$$R_2 = V_2/I_2$$

where $V_2$ is the voltage across one or more second components and $I_2$ is the current flowing through one or more second components.

Monitor 140 for one embodiment may then measure a ratio between resistance $R_1$ and resistance $R_2$ for block 402 in accordance with the following equation.

$$R_1/R_2 = (V_1 * I_2)/(V_2 * I_1)$$

Monitor 140 for one embodiment may measure package resistance $R_{package}(T_1)$ for block 404 in accordance with the following equation.

$$R_{package}(T_1) = R_{package}(T_0) * R_1/R_2(T_1)/R_1/R_2(T_0)$$

Monitor 140 for one embodiment may use the ratio $R_1/R_2$ as characteristic X because such a ratio for one embodiment may be measured relatively accurately without having to measure the resistance $R_1$ accurately or resistance $R_2$ accurately.

EXAMPLE CIRCUITRY FOR MONITOR

Monitor 140 may comprise any suitable circuitry. Monitor 140 for one embodiment may be implemented at least in part by instructions to be performed by integrated circuit 110. Such instructions may be stored and/or embedded on any suitable medium which may be accessed to perform such instructions. Integrated circuit 110 for one embodiment may comprise such a medium. Integrated circuit 110 for one embodiment may be coupled to receive instructions from such a medium.

Figure 5:
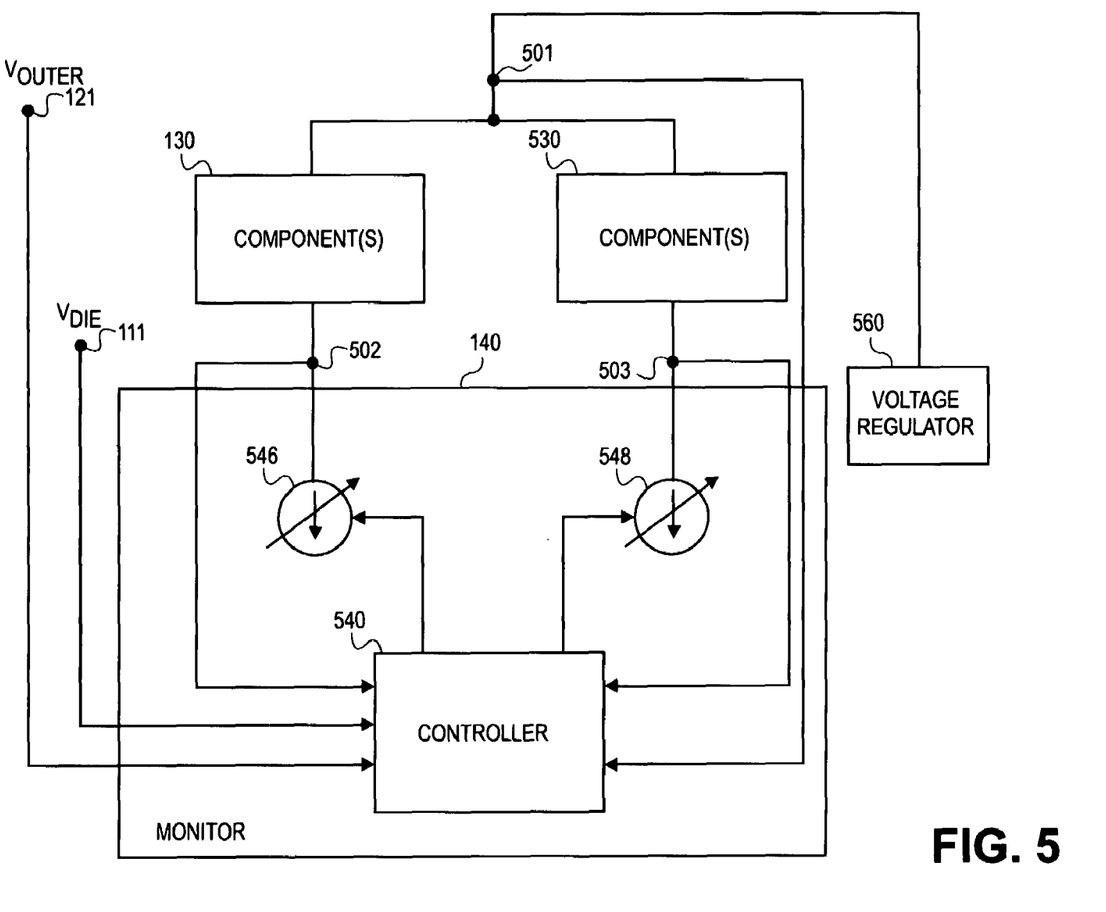
FIG. 5 illustrates, for one embodiment, circuitry to measure a resistance of the package for the packaged integrated circuit of FIG. 1.

Monitor 140 for one embodiment, as illustrated in FIG. 5, may comprise a controller 540, a programmable current source 546, and a programmable current source 548.

Programmable current source 546 for one embodiment may be coupled to draw a current $I_1$ through any suitable one or more components 130. Component(s) 130 for one embodiment may be coupled between a supply voltage node 501 and programmable current source 546.

Component(s) 130 for one embodiment may be dedicated for use to carry current through package 120 to help measure a resistance of package 120. Integrated circuit 110 for one embodiment may therefore continue operating to perform any suitable one or more functions as monitor 140 controls current through one or more components 130 to help measure a resistance of package 120.

For one embodiment where integrated circuit 110 is positioned over a substrate to help package integrated circuit 110 in package 120, the substrate may have one or more components 130. One or more components 130 for one embodiment may be arranged to help replicate variation in the resistance $R_{package}$ of package 120 during operation of integrated circuit 110. Generally extending or distributing one or more components 130 throughout package 120 for one embodiment may help better replicate such variation. One or more components 130 for one embodiment may carry current on more than one side of integrated circuit 110, such as on two, three, or four sides for example.

Figure 6:
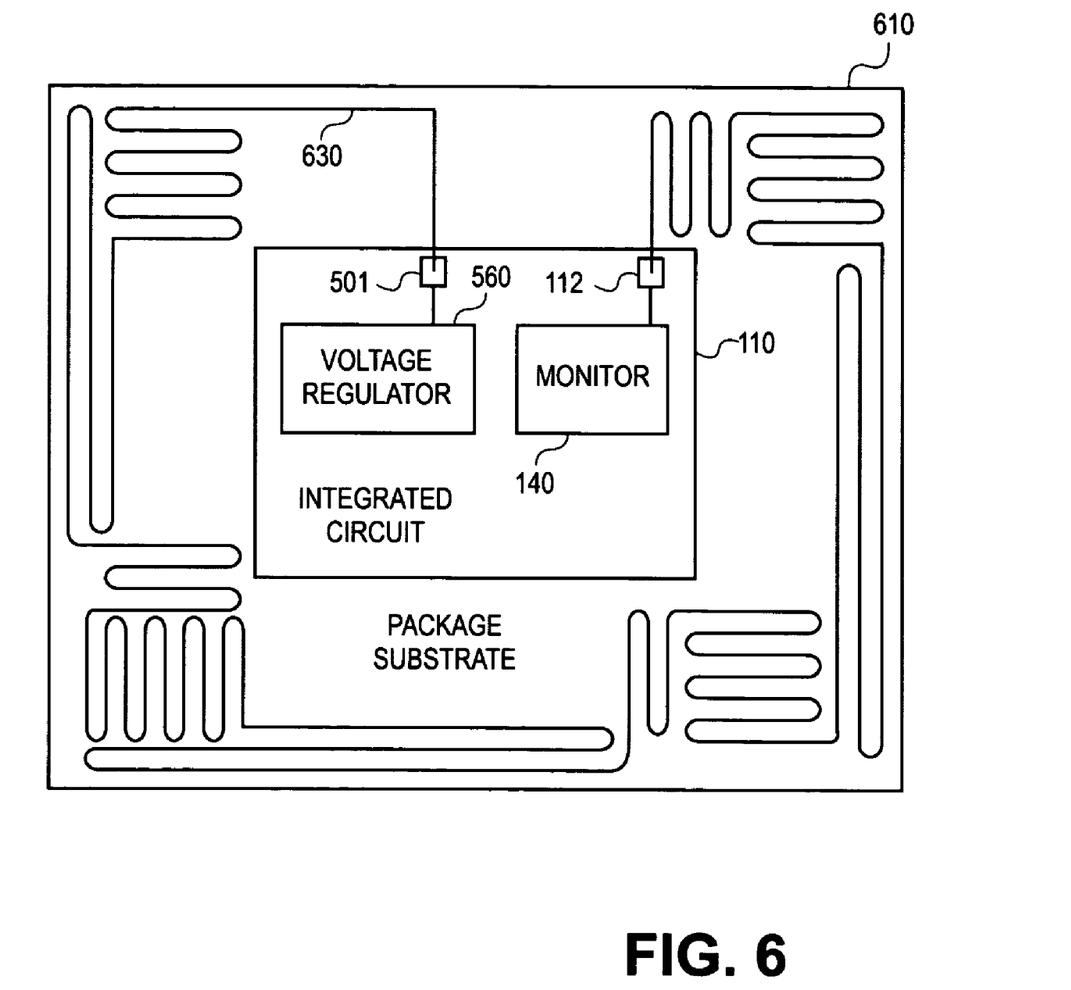
FIG. 6 illustrates, for one embodiment, one or more components that are to carry current through the package for the packaged integrated circuit of FIG. 1.

FIG. 6 illustrates for one embodiment a conductive line 630 routed throughout a package substrate 610 on four sides of integrated circuit 110 positioned over package substrate 610 to help implement component(s) 130. Conductive line 630 for one embodiment may be routed to resemble a snake. Package substrate 610 for one embodiment may be designed with conductive line 630 routed through available space in, on, and/or over package substrate 610 following placement of other components, such as other lines for example, in, on, and/or over package substrate 610. Conductive line 630 may comprise any suitable conductive material, such as copper for example. Conductive line 630 may comprise any suitable conductive material that may or may not have a resistance that is linear with temperature. Conductive line 630 for one embodiment may comprise the same conductive material as that used for supply line(s) to supply power to integrated circuit 110. Using the same conductive material in this manner for one embodiment may help better correlate effects of temperature on such supply line(s).

Programmable current source 548 for one embodiment may be coupled to draw a current $I_2$ through any suitable one or more components 530. Component(s) 530 for one embodiment may be coupled between supply voltage node 501 and programmable current source 548.

One or more components 530 may be positioned at any suitable location in integrated circuit 110 and/or package 120. One or more components 530 for one embodiment may be substantially temperature independent, that is have a resistance with relatively minimal deviation despite temperature variations within a temperature operating range. One or more components 530 for one embodiment may be substantially supply voltage independent, that is have a resistance with relatively minimal deviation despite supply voltage variations within an operating range of a supply voltage supplied to packaged integrated circuit 100. One or more components 530 for one embodiment may be substantially temperature independent and substantially supply voltage independent.

One or more components 130 for one embodiment may generally have a resistance $R_1$ that is approximately the same as or within a certain amount or percentage of a resistance $R_2$ of one or more components 530.

Controller 540 for one embodiment may be coupled to measure a voltage at, or a voltage corresponding to a voltage at, supply voltage node 501, a node 502 between one or more components 130 and programmable current source 546, and/or a node 503 between one or more components 530 and programmable current source 548. Controller 540 for one embodiment may measure a voltage $V_1$, or a voltage corresponding to a voltage $V_1$, across one or more components 130 by identifying the difference between the measured voltages from nodes 501 and 502. Controller 540 for one embodiment may measure a voltage $V_2$, or a voltage corresponding to a voltage $V_2$, across one or more components 530 by identifying the difference between the measured voltages from nodes 501 and 503.

A voltage regulator 560 for one embodiment may be used to help generate a relatively constant voltage at supply voltage node 501. Voltage regulator 560 for one embodiment may be coupled to receive a supply voltage from the same power supply that is to supply a supply voltage to integrated circuit 110. Voltage regulator 560 for one embodiment, as illustrated in FIG. 6, may be located on integrated circuit 110. Voltage regulator 560 for one embodiment may be located on a substrate used to help package integrated circuit 110 in package 120. Voltage regulator 560 for one embodiment may be external to packaged integrated circuit 100.

Although illustrated as coupled to a common supply voltage node 501, one or more components 130 and one or more components 530 may be coupled to separate supply voltage nodes. Controller 540 for one embodiment may then be coupled to measure voltages from such separate supply voltage nodes.

Controller 540 for one embodiment may be coupled to control programmable current sources 546 and 548 to measure a resistance $R_{package}$ of package 120 based at least in part on a reference resistance of package 120, the amount of current $I_1$ drawn through one or more components 130, and the amount of current I2 drawn through one or more components 530. Controller 540 for one embodiment may control programmable current source 546 to generate a voltage $V_1$ across one or more components 130 and may control programmable current source 548 to generate a voltage $V_2$ across one or more components 530, wherein voltage $V_1$ is to satisfy one or more predetermined relationships with voltage $V_2$.

Controller 540 for one embodiment may be coupled to measure a characteristic X of packaged integrated circuit 100 based at least in part on the amount of current $I_1$ and the amount of current $I_2$ to help measure a resistance $R_{package}$ of package 120. Controller 540 for one embodiment may be coupled to measure a ratio between a resistance $R_1$ of one or more components 130 and a resistance $R_2$ of one or more components 530 based at least in part on the amount of current $I_1$ and the amount of current I2 to help measure a resistance $R_{package}$ of package 120.

Figure 7:
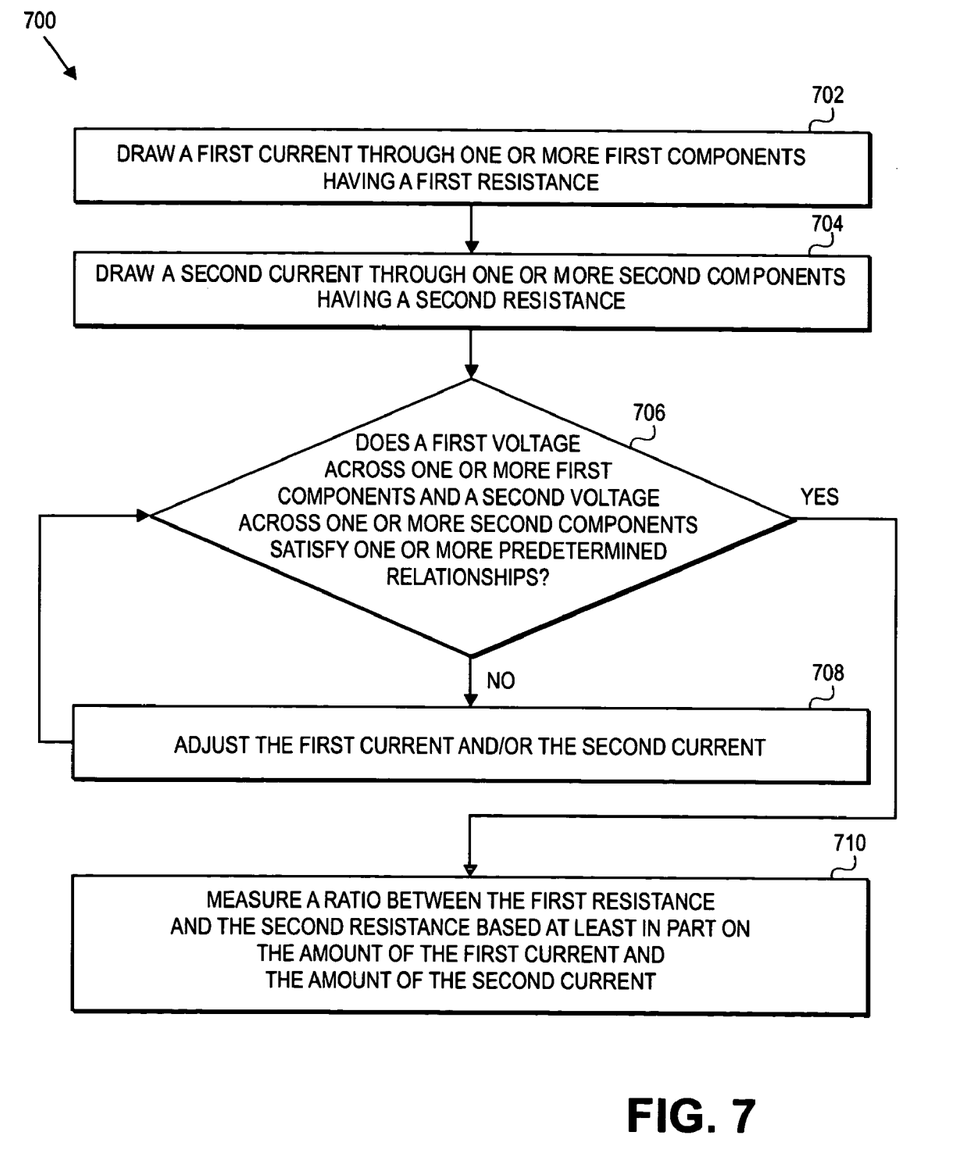
FIG. 7 illustrates, for one embodiment, a flow diagram to measure a characteristic of a packaged integrated circuit for the flow diagram of FIG. 4.

Controller 540 for one embodiment may measure a ratio between a resistance $R_1$ of one or more components 130 and a resistance $R_2$ of one or more components 530 in accordance with a flow diagram 700 of FIG. 7.

For block 702 of FIG. 7, controller 540 may control programmable current source 546 to draw a current $I_2$ through one or more components 130 having a resistance $R_1$. Controller 540 for block 704 may control programmable current source 548 to draw a current I2 through one or more components 530 having a resistance $R_2$. Resistance $R_2$ for one embodiment may be relatively constant.

For block 706, controller 540 may identify whether a voltage $V_1$ across one or more components 130 and a voltage $V_2$ across one or more components 530 satisfy one or more predetermined relationships. Controller 540 for one embodiment may identify for block 706 whether the absolute value of the difference between voltage $V_1$ and voltage $V_2$ is less than, or less than or equal to, a predetermined amount or a predetermined percentage of either voltage $V_1$ or voltage $V_2$.

Controller 540 for one embodiment may identify for block 706 whether voltage $V_1$ and voltage $V_2$ are substantially equal. For one embodiment where one or more components 130 and one or more components 530 are coupled to a common supply voltage node 501, controller 540 for one embodiment may identify for block 706 whether measured voltages from nodes 502 and 503 satisfy one or more predetermined relationships.

If voltage $V_1$ and voltage $V_2$ do not satisfy one or more predetermined relationships for block 706, controller 540 for block 708 may control programmable current source 546 to adjust current $I_1$ through one or more components 130 and/or control programmable current source 548 to adjust current $I_2$ through one or more components 530. Controller 540 for one embodiment for block 708 may adjust current $I_1$ and/or current $I_2$ in any suitable manner to help voltage $V_1$ and voltage $V_2$ satisfy one or more predetermined relationships for block 706. Controller 540 may repeat operations for blocks 706 and 708 until voltage $V_1$ and voltage $V_2$ satisfy one or more predetermined relationships for block 706.

If voltage $V_1$ and voltage $V_2$ do satisfy one or more predetermined relationships for block 706, controller 540 for block 710 may measure a ratio between a resistance $R_1$ of one or more components 130 and a resistance $R_2$ of one or more components 530 based at least in part on the amount of current $I_1$ and the amount of current $I_2$ to help measure a resistance $R_{package}$ of package 120. Controller 540 for one embodiment may measure such a ratio in accordance with the following equation.

$$R_1/R_2=(V_1*I_2)/(V_2*I_1)$$

Controller 540 for one embodiment may then measure a resistance $R_{package}$ of package 120 in accordance with the following equation.

$$R_{package}(T_1)=R_{package}(T_0)*R_1/R_2(T_1)/R_1/R_2(T_0)$$

Controller 540 for one embodiment may be coupled to measure power supplied to integrated circuit 110 based at least in part on the measured package resistance $R_{package}$. Controller 540 for one embodiment, as illustrated in FIG. 5, may be coupled to measure a voltage $V_{die}$ of a die for integrated circuit 110 at a node 111 and an outer voltage $V_{outer}$ at a node 121 at or near an outer side of package 120. Controller 540 for one embodiment may then measure package voltage $V_{package}$ in accordance with the following equation:

$$V_{package}=V_{outer}-V_{die}$$

and measure power P supplied to integrated circuit 110 in accordance with the following equation.

$$P=(V_{package}*V_{die})/R_{package}$$

Controller 540 and programmable current sources 546 and 548 may be implemented in any suitable manner.

Figure 8:
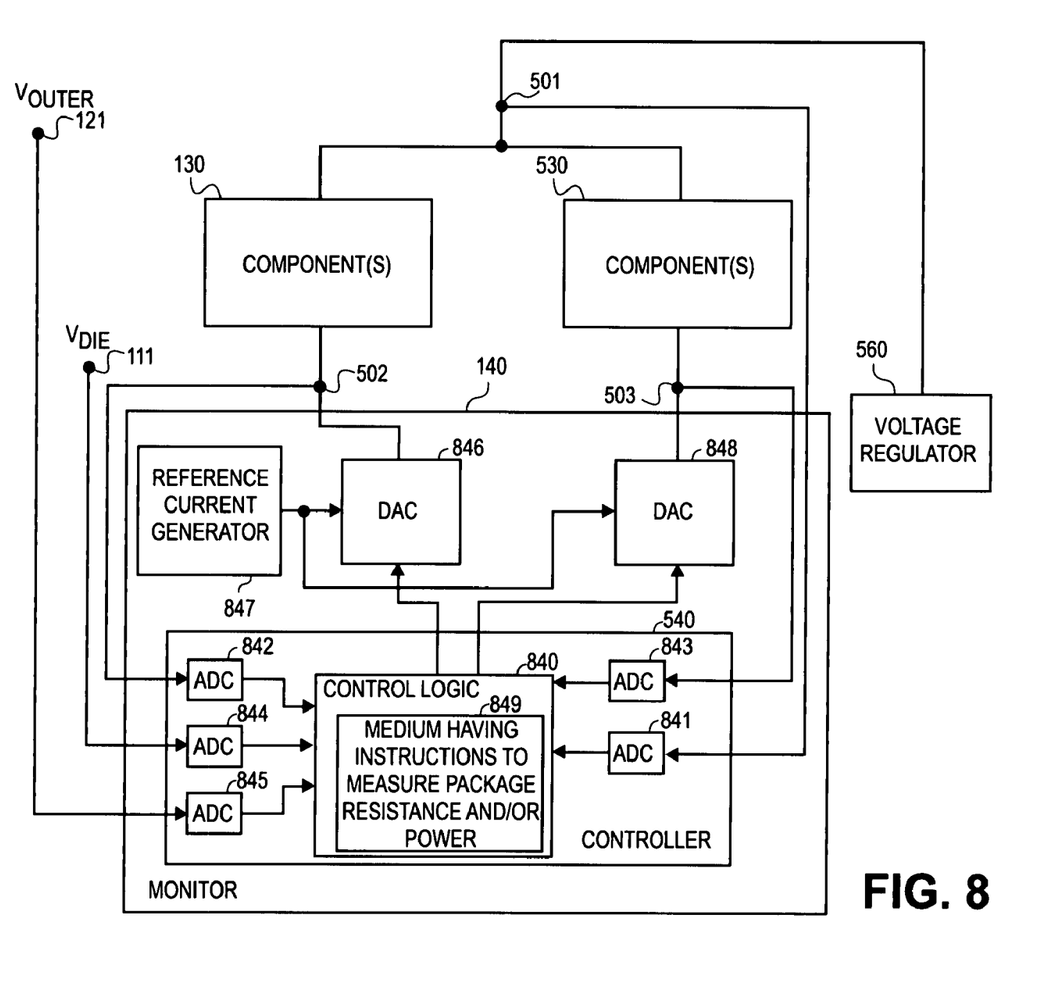
FIG. 8 illustrates, for one embodiment, circuitry to measure a resistance of the package for the packaged integrated circuit of FIG. 1.

Controller 540 for one embodiment, as illustrated in FIG. 8, may comprise control logic 840 and analog-to-digital converters (ADCs) 841, 842, and 843 coupled to allow control logic 840 to measure voltages from nodes 501, 502, and 503, respectively. Controller 540 for one embodiment, as illustrated in FIG. 8, may also comprise analog-to-digital converters (ADCs) 844 and 845 coupled to allow control logic 840 to measure voltages from nodes 111 and 121, respectively.

Control logic 840 for one embodiment may comprise any suitable logic to perform any suitable instructions to help control programmable current sources 546 and 548 and to help measure a resistance $R_{package}$ of package 120. Control logic 840 for one embodiment may comprise any suitable logic to also perform any suitable instructions to help measure power supplied to integrated circuit 10. Instructions to be performed by control logic 840 for one embodiment may be stored and/or embedded on any suitable medium which may be accessed to perform such instructions. Control logic 840 for one embodiment, as illustrated in FIG. 8, may comprise such a medium 849. Control logic 840 for one embodiment may be coupled to receive instructions from such a medium.

Programmable current source 546 for one embodiment, as illustrated in FIG. 8, may comprise a digital-to-analog converter (DAC) 846 coupled to receive a reference current $I_{ref}$ from a reference current generator 847. DAC 846 for one embodiment may be coupled to receive a control bits setting DAC, generated from controller 540 to control DAC 846 and therefore to control the amount of current $I_1$ drawn through one or more components 130. DAC 846 may comprise any suitable circuitry and may have any suitable control bits setting of any suitable number of bits to control current $I_1$, with any suitable resolution. DAC 846 for one embodiment may have a control bit setting of 8, 9, or 10 bits, for example, in length. For one embodiment, as illustrated in FIG. 8, control logic 840 may be used to generate control bits setting $DAC_1$.

Programmable current source 548 for one embodiment, as illustrated in FIG. 8, may comprise a digital-to-analog converter (DAC) 848 coupled to receive reference current $I_{ref}$ from reference current generator 847. DAC 848 for one embodiment may be coupled to receive a control bits setting $DAC_2$ generated from controller 540 to control DAC 848 and therefore to control the amount of current $I_2$ drawn through one or more components 530. DAC 848 may comprise any suitable circuitry and may have any suitable control bits setting of any suitable number of bits to control current $I_2$ with any suitable resolution. DAC 848 for one embodiment may have a control bit setting of 8, 9, or 10 bits, for example, in length. For one embodiment, as illustrated in FIG. 8, control logic 840 may be used to generate control bits setting $DAC_2$.

Controller 540 for one embodiment for blocks 706 and 708 of FIG. 7 may adjust control bits setting $DAC_1$ and/or control bits setting $DAC_2$ until voltage $V_1$ and voltage $V_2$ are substantially equal to help reduce or minimize mismatch in drain-source voltage ($V_{ds}$) of field effect transistors (FETs) for DACs 846 and 848 and therefore help reduce or minimize $V_{ds}$ modulation error.

Reference current generator 847 may comprise any suitable circuitry to generate reference Current $I_{ref}$. Reference current generator 847 for one embodiment may comprise circuitry having a relatively high impedance current mirror design such as, for example, a wide swing cascode current mirror having a relatively high output impedance. Such a high impedance current mirror design for one embodiment may help reduce or minimize variations in currents $I_1$ and $I_2$ because of any mismatch in drain-source voltage ($V_{ds}$) of field effect transistors (FETs) for DACs 846 and 848 and therefore help reduce or minimize $V_{ds}$ modulation error.

For one embodiment, the same reference current $I_{ref}$ may be used for DACs 846 and 848 to draw currents $I_1$ and $I_2$, respectively, that are generally proportional to control bits settings $DAC_1$ and $DAC_2$, respectively. Controller 540 for one embodiment may therefore measure a ratio between a resistance $R_1$ of one or more components 130 and a resistance $R_2$ of one or more components 530 in accordance with the following equation.

$$R_1/R_2 = (V_1 * DAC_2)/(V_2 * DAC_1)$$

Controller 540 for one embodiment may therefore measure the ratio $R_1/R_2$ relatively accurately without having to measure current $I_1$, resistance $R_1$, current $I_2$, or resistance $R_2$.

EXAMPLE SYSTEM

Figure 9:
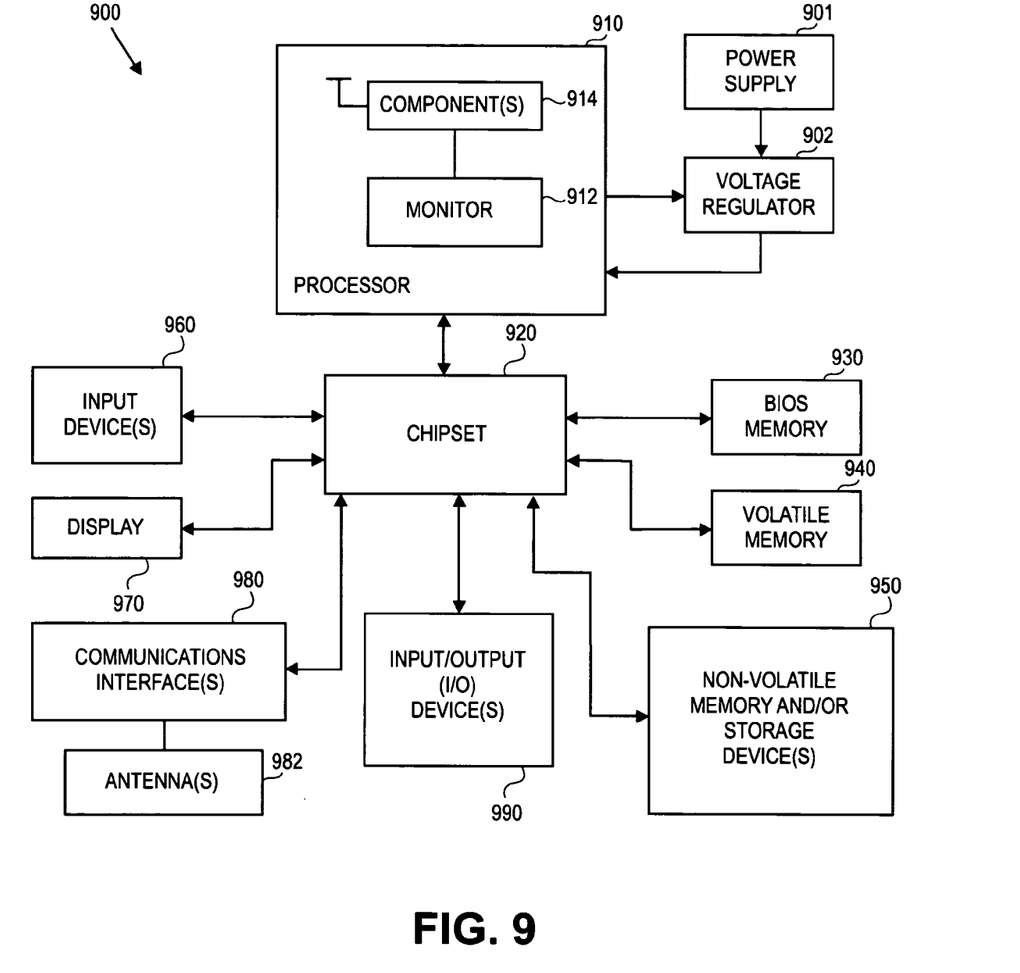
FIG. 9 illustrates, for one embodiment, a block diagram of an example system comprising a processor having a monitor to measure a resistance of a package for the processor based at least in part on a reference resistance of the package and a resistance of one or more components that are to carry current through the package.

Packaged integrated circuit 100 may be designed for use in any suitable system. Packaged integrated Circuit 100 for one embodiment may be designed to form at least a portion of a processor 910 for use in a system 900 as illustrated in FIG. 9. That is, processor 910 may have a monitor 912 to measure a resistance of a package for processor 910 based at least in part on a reference resistance of the package and a resistance of one or more components 914 that are to carry current through the package. Monitor 912 and component(s) 914 for one embodiment may correspond to monitor 140 and component(s) 130, respectively, of FIG. 1.

Component(s) 914 for one embodiment may be dedicated for use to carry current through a package for processor 910 to help measure a resistance of the package. Processor 910 for one embodiment may therefore continue operating to perform any suitable one or more functions as monitor 912 controls current through one or more components 914 to help measure a resistance of the package. Processor 910 for one embodiment may continue performing instructions as monitor 912 controls current through one or more components 914 to help measure a resistance of the package. For one embodiment where processor 910 comprises a multiple core architecture, processor 910 for one embodiment may continue performing instructions on one or more cores, including on all cores for example, as monitor 912 controls current through one or more components 914 to help measure a resistance of the package.

Processor 910 for one embodiment may optionally control power for processor 910 based at least in part on the measured resistance of the package for processor 910.

Processor 910 for one embodiment may optionally control a variable clock source based at least in part on the measured package resistance to vary the frequency of one or more clock signals generated by the variable clock source to clock or activate circuitry of processor 910 and therefore help control power consumption and/or heat dissipation for processor 910. The variable clock source for one embodiment may correspond to variable clock source 156 of FIG. 1.

Processor 910 for one embodiment may optionally control a voltage regulator 902 coupled to a power supply 901 based at least in part on the measured package resistance to vary a supply voltage supplied to processor 910 by voltage regulator 902 and therefore help control power consumption and/or heat dissipation for processor 910. Power supply 901 and voltage regulator 902 for one embodiment may correspond to variable power supply 158 of FIG. 1.

System 900 for one embodiment may also comprise a chipset 920 coupled to processor 910, a basic input/output system (BIOS) memory 930 coupled to chipset 920, volatile memory 940 coupled to chipset 920, non-volatile memory and/or storage device(s) 950 coupled to chipset 920, one or more input devices 960 coupled to chipset 920, a display 970 coupled to chipset 920, one or more communications interfaces 980 coupled to chipset 920, and/or one or more other input/output (I/O) devices 990 coupled to chipset 920.

Chipset 920 for one embodiment may comprise any suitable interface controllers to provide for any suitable communications link to processor 910 and/or to any suitable device or component in communication with chipset 920.

Chipset 920 for one embodiment may comprise a firmware controller to provide an interface to BIOS memory 930. BIOS memory 930 may be used to store any suitable system and/or video BIOS software for system 900. BIOS memory 930 may comprise any suitable non-volatile memory, such as a suitable flash memory for example. BIOS memory 930 for one embodiment may alternatively be included in chipset 920.

Chipset 920 for one embodiment may comprise one or more memory controllers to provide an interface to volatile memory 940. Volatile memory 940 may be used to load and store data and/or instructions, for example, for system 900. Volatile memory 940 may comprise any suitable volatile memory, such as suitable dynamic random access memory (DRAM) for example.

Chipset 920 for one embodiment may comprise a graphics controller to provide an interface to display 970. Display 970 may comprise any suitable display, such as a cathode ray tube (CRT) or a liquid crystal display (LCD) for example. The graphics controller for one embodiment may alternatively be external to chipset 920.

Chipset 920 for one embodiment may comprise one or more input/output (I/O) controllers to provide an interface to non-volatile memory and/or storage device(s) 950, input device(s) 960, communications interface(s) 980, and/or I/O devices 990.

Non-volatile memory and/or storage device(s) 950 may be used to store data and/or instructions, for example. Non-volatile memory and/or storage device(s) 950 may comprise any suitable non-volatile memory, such as flash memory for example, and/or may comprise any suitable nonvolatile storage device(s), such as one or more hard disk drives (HDDs), one or more compact disc (CD) drives, and/or one or more digital versatile disc (DVD) drives for example.

Input device(s) 960 may comprise any suitable input device(s), such as a keyboard, a mouse, and/or any other suitable cursor control device.

Communications interface(s) 980 may provide an interface for system 900 to communicate over one or more networks and/or with any other suitable device. Communications interface(s) 980 may comprise any suitable hardware and/or firmware. Communications interface(s) 980 for one embodiment may comprise, for example, a network adapter, a wireless network adapter, a telephone modem, and/or a wireless modem. For wireless communications, communications interface(s) 980 for one embodiment may use one or more antennas 982.

I/O device(s) 990 may comprise any suitable I/O device(s) such as, for example, an audio device to help convert sound into corresponding digital signals and/or to help convert digital signals into corresponding sound, a camera, a camcorder, a printer, and/or a scanner.

Although described as residing in chipset 920, one or more controllers of chipset 920 may be integrated with processor 910, allowing processor 910 to communicate with one or more devices or components directly. As one example, one or more memory controllers for one embodiment may be integrated with processor 910, allowing processor 910 to communicate with volatile memory 940 directly.

In the foregoing description, example embodiments have been described. Various modifications and changes may be made to such embodiments without departing from the scope of the appended claims. The description and drawings are, accordingly, to be regarded in an illustrative rather than a restrictive sense.

What is claimed is:

1. An integrated circuit comprising:
   a node to couple one or more components to the integrated circuit to carry current through a package for the integrated circuit; and
   a monitor to measure a resistance in the package based at least in part on a reference resistance of the package and a resistance of one or more components that are to carry current through the package.

2. The integrated circuit of claim 1, wherein the monitor is to measure a resistance of the package at a first temperature, and
   wherein the reference resistance of the package is based on a measured resistance of the package at a second temperature.

3. The integrated circuit of claim 1, wherein the monitor is to measure a characteristic based at least in part on a resistance of one or more components that are to carry current through the package to help measure a resistance of the package.

4. The integrated circuit of claim 1, wherein the monitor is to measure a ratio between a resistance of one or more components that are to carry current through the package and a resistance of one or more components to help measure a resistance of the package.

5. The integrated circuit of claim 1, wherein the monitor is to measure power supplied to the integrated circuit based at least in part on the measured resistance.

6. The integrated circuit of claim 1, comprising a controller to control power based at least in part on the measured resistance.

7. The integrated circuit of claim 1, in combination with a substrate having one or more components to carry current through the package,
   wherein the integrated circuit is positioned over the substrate and the substrate has one or more components to carry current on more than one side of the integrated circuit.

8. The integrated circuit of claim 1, wherein the integrated circuit forms at least a portion of a processor and wherein the processor may perform instructions as the monitor controls current through one or more components to help measure a resistance of the package.

9. An apparatus comprising:
   a first programmable current source to draw a first current through one or more first components that are to carry current through a package for the integrated circuit;
   a second programmable current source to draw a second current through one or more second components; and
   a controller to control the first and second programmable current sources to measure a resistance in the package based at least in part on a reference resistance of the package, the amount of the first current, and the amount of the second current.

10. The apparatus of claim 9, wherein the controller is to control the first programmable current source to generate a first voltage across one or more first components and is to control the second programmable current source to generate a second voltage across one or more second components, wherein the first voltage is to satisfy one or more predetermined relationships with the second voltage.

11. The apparatus of claim 10, wherein the first voltage is substantially equal to the second voltage.

12. The apparatus of claim 9, wherein the first programmable current source comprises a first digital-to-analog converter coupled to a reference current generator,
   wherein the second programmable current source comprises a second digital-to-analog converter coupled to the reference current generator, and
   wherein the controller is to generate a first control bits setting to control the first digital-to-analog converter and a second control bits setting to control the second digital-to-analog converter.

13. The apparatus of claim 9, wherein the controller is to measure a characteristic based at least in part on the amount of the first and second currents to help measure a resistance of the package.

14. The apparatus of claim 9, wherein the controller is to measure a ratio between a resistance of one or more first components and a resistance of one or more second components based at least in part on the amount of the first and second currents to help measure a resistance of the package.

15. The apparatus of claim 9, wherein the controller is to measure a resistance of the package at a first temperature, and
   wherein the reference resistance of the package is based on a measured resistance of the package at a second temperature.

16. The apparatus of claim 9, wherein the controller is to measure power supplied to the integrated circuit based at least in part on the measured resistance.

17. The apparatus of claim 9, comprising another controller to control power based at least in part on the measured resistance.

18. The apparatus of claim 9, comprising a substrate having one or more first components,
   wherein the integrated circuit is positioned over the substrate and the substrate has one or more first components to carry current on more than one side of the integrated circuit.

19. The apparatus of claim 9, wherein one or more first components are dedicated for use to carry current through the package to help measure a resistance of the package.

20. A medium having instructions which, when performed by an integrated circuit, cause the integrated circuit to:
   control current through one or more components that are to carry current through a package for an integrated circuit; and
   measure a resistance in the package based at least in part on a reference resistance of the package and a resistance of one or more components that are to carry current through the package.

21. The medium of claim 20, wherein the instructions cause the integrated circuit to generate digital-to-analog converter control bits to control current through one or more components that are to carry current through the package.

22. The medium of claim 20, wherein the instructions cause the integrated circuit to measure a resistance of the package at a first temperature, and
   wherein the reference resistance of the package is based on a measured resistance of the package at a second temperature.

23. The medium of claim 20, wherein the instructions cause the integrated circuit to measure a characteristic based at least in part on a resistance of one or more components that are to carry current through the package to help measure a resistance of the package.

24. The medium of claim 20, wherein the instructions cause the integrated circuit to measure a ratio between a resistance of one or more first components that are to carry current through the package and a resistance of one or more second components to help measure a resistance of the package.

25. The medium of claim 20, wherein the instructions cause the integrated circuit to measure power supplied to the integrated circuit based at least in part on the measured resistance.

26. The medium of claim 20, wherein the instructions cause the integrated circuit to control power based at least in part on the measured resistance.

27. A method comprising:
   controlling current through one or more components that are to carry current through a package for an integrated circuit; and
   measuring a resistance in the package based at least in part on a reference resistance of the package and a resistance of one or more components that are to carry current through the package.

28. The method of claim 27, wherein controlling current through one or more components comprises generating digital-to-analog converter control bits to control current through one or more components that are to carry current through the package.

29. The method of claim 27, wherein measuring a resistance of the package comprises measuring a resistance of the package at a first temperature, and
   wherein the reference resistance of the package is based on a measured resistance of the package at a second temperature.

30. The method of claim 27, wherein measuring a resistance of the package comprises measuring a characteristic based at least in part on a resistance of one or more components that are to carry current through the package.

31. The method of claim 27, wherein measuring a resistance of the package comprises measuring a ratio between a resistance of one or more first components that are to carry current through the package and a resistance of one or more second components.

32. The method of claim 27, comprising:
   measuring power supplied to the integrated circuit based at least in part on the measured resistance.

33. The method of claim 27, comprising:
   controlling power based at least in part on the measured resistance.

34. A system comprising:
   a battery; and
   a packaged integrated circuit coupled to receive power from the battery, the packaged integrated circuit comprising one or more components that are to carry current through a package of the packaged integrated circuit and a monitor to measure a resistance in the package based at least in part on a reference resistance of the package and a resistance of one or more components that are to carry current through the package.

35. The system of claim 34, wherein the monitor is to measure a resistance of the package at a first temperature, and
   wherein the reference resistance of the package is based on a measured resistance of the package at a second temperature.

36. The system of claim 34, comprising a controller to control power based at least in part on the measured resistance.

37. The system of claim 34, wherein the packaged integrated circuit forms at least a portion of a processor and wherein the processor may perform instructions as the monitor controls current through one or more components to help measure a resistance of the package.

* * * * *